(12) United States Patent
Fang et al.

(10) Patent No.: US 11,309,698 B2
(45) Date of Patent: Apr. 19, 2022

(54) ELECTROSTATIC PREVENTION CIRCUIT, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haobo Fang, Beijing (CN); Yanna Xue, Beijing (CN); Zhiying Bao, Beijing (CN); Yong Zhang, Beijing (CN); Lei Mi, Beijing (CN); Lu Bai, Beijing (CN); Gang Hua, Beijing (CN); Jingpeng Wang, Beijing (CN); Lingxiang Yuan, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 933 days.

(21) Appl. No.: 16/073,987

(22) PCT Filed: Dec. 15, 2017

(86) PCT No.: PCT/CN2017/116496
§ 371 (c)(1),
(2) Date: Jul. 30, 2018

(87) PCT Pub. No.: WO2018/205612
PCT Pub. Date: Nov. 15, 2018

(65) Prior Publication Data
US 2021/0210943 A1    Jul. 8, 2021

(30) Foreign Application Priority Data
May 10, 2017 (CN) .................. 201710326955.X (51) Int. Cl.
H02H 1/06 (2006.01)
H01L 27/02 (2006.01)
(Continued)

(52) U.S. Cl.
CPC ......... *H02H 1/063* (2013.01); *H01L 27/0292* (2013.01); *H02H 9/046* (2013.01);
(Continued)

(58) Field of Classification Search
CPC ............. H01L 27/0248; H01L 27/0266; H01L 27/0288; H01L 27/0292; H02H 1/063; H02H 9/046; G02F 1/136204
(Continued)

(56) References Cited

U.S. PATENT DOCUMENTS 5,744,837 A    4/1998  Kamiura et al.
2011/0285690 A1*  11/2011  Li .......................... G09G 3/20
                                                          345/212
(Continued)

FOREIGN PATENT DOCUMENTS

CN    201349132 Y    11/2009
CN    103515941 A    1/2014
CN    103928459 A    7/2014
(Continued)

OTHER PUBLICATIONS

International Search Report of PCT/CN2017/116496 in Chinese, dated Mar. 23, 2018 with English translation.
(Continued)

*Primary Examiner* — Kevin J Comber
(74) *Attorney, Agent, or Firm* — Collard & Roe, P.C.

(57) ABSTRACT

An electrostatic prevention circuit, an array substrate and a display device are provided. The electrostatic prevention circuit includes an electrostatic prevention sub-circuit, and the electrostatic prevention sub-circuit includes a thin film transistor and a capacitor; a gate electrode of the thin film transistor is connected to the capacitor, and the thin film transistor is controlled by a signal passing through the capacitor.

11 Claims, 8 Drawing Sheets

(51) Int. Cl.
  *H02H 9/04*    (2006.01)
  *G02F 1/1362*  (2006.01)
(52) U.S. Cl.
  CPC .... *G02F 1/136204* (2013.01); *H01L 27/0266* (2013.01); *H01L 27/0288* (2013.01)
(58) Field of Classification Search
  USPC .......................................................... 361/56
  See application file for complete search history.

(56) References Cited

U.S. PATENT DOCUMENTS

2014/0192444 A1   7/2014  Wu et al.
2015/0160522 A1   6/2015  Wu et al.

FOREIGN PATENT DOCUMENTS

CN    103944154 A    7/2014
CN    106200172 A    12/2016
CN    106909010 A    6/2017

OTHER PUBLICATIONS

Notice of Transmittal of the International Search Report of PCT/CN2017/116496 in Chinese, dated Mar. 23, 2018.
Written Opinion of the International Searching Authority of PCT/CN2017/116496 in Chinese, dated Mar. 23, 2018 with English translation.
Chinese Office Action in Chinese Application No. 201710326955.X, dated Aug. 22, 2019 with English translation.

\* cited by examiner

ELECTROSTATIC PREVENTION CIRCUIT, ARRAY SUBSTRATE AND DISPLAY DEVICE

CROSS REFERENCE TO RELATED APPLICATIONS

This application is the National Stage of PCT/CN2017/116496 filed on Dec. 15, 2017, which claims priority under 35 U.S.C. § 119 of Chinese Application No. 201710326955.X filed on May 10, 2017, the disclosure of which is incorporated by reference.

TECHNICAL FIELD

At least one embodiment of the present disclosure relates to an electrostatic prevention circuit, array substrate and a display device.

BACKGROUND

In thin film transistor-liquid crystal display (TFT-LCD) manufacturing industry, electrostatic problems directly affect the yield of the production of the TFT-LCD. Due to various ways in which static electricity is generated, high-voltage static electricity is easily generated in many manufacturing processes or in a use process of the TFT-LCD. For example, in a friction process, frictions between a friction cloth and a display panel of the TFT-LCD produce the high-voltage static electricity. The high-voltage static electricity is very likely to cause breakdown of a thin film transistor which controls the driving of a pixel of the TFT-LCD, so that the driving of the pixel fails and the quality of the TFT-LCD is decreased. Thus, it is required to release or balance the high-voltage static electricity timely and effectively in the TFT-LCD.

SUMMARY

At least one embodiment of the present disclosure provides an electrostatic prevention circuit, and the electrostatic prevention circuit includes an electrostatic prevention sub-circuit including a thin film transistor and a capacitor; a gate electrode of the thin film transistor is connected to the capacitor.

For example, in the electrostatic prevention circuit provided by at least one embodiment of the present disclosure, the thin film transistor includes a first thin film transistor and a second thin film transistor; a gate electrode of the first thin film transistor is connected to a first electrode of the capacitor, and a second electrode of the capacitor is connected to a first electrode of the second thin film transistor; and a gate electrode of the second thin film transistor is connected to a second electrode of the first thin film transistor.

For example, in the electrostatic prevention circuit provided by at least one embodiment of the present disclosure, the second electrode of the capacitor and the a first electrode of the first thin film transistor are connected to a same terminal, or are connected to different terminals respectively; the second electrode of the first thin film transistor and a second electrode of the second thin film transistor are connected to a same terminal, or are connected to different terminals respectively.

For example, in the electrostatic prevention circuit provided by at least one embodiment of the present disclosure, the second electrode of the first thin film transistor and a second electrode of the second thin film transistor are connected to a same connection structure.

For example, the electrostatic prevention circuit provided by at least one embodiment of the present disclosure includes at least two of the electrostatic prevention sub-circuits that are connected to each other.

For example, in the electrostatic prevention circuit provided by at least one embodiment of the present disclosure, the electrostatic prevention circuit is symmetric, and two of the at least two of the electrostatic prevention sub-circuits share a same thin film transistor.

For example, in the electrostatic prevention circuit provided by at least one embodiment of the present disclosure, the thin film transistor includes a first thin film transistor, a second thin film transistor and a third thin film transistor; the capacitor includes a first capacitor and a second capacitor; a gate electrode of the first thin film transistor is connected to a first electrode of the first capacitor, and a second electrode of the first capacitor is connected to a first electrode of the first thin film transistor and a first electrode of the second thin film transistor; a gate electrode of the second thin film transistor is connected to a second electrode of the first thin film transistor and a second electrode of the third thin film transistor; and a gate electrode of the third thin film transistor is connected to a first electrode of the second capacitor, and a second electrode of the second capacitor is connected to a first electrode of the third thin film transistor and a second electrode of the second thin film transistor.

For example, in the electrostatic prevention circuit provided by at least one embodiment of the present disclosure, the thin film transistor includes a first thin film transistor, a second thin film transistor, a third thin film transistor and a fourth thin film transistor; the capacitor includes a first capacitor and a second capacitor; a gate electrode of the first thin film transistor is connected to a first electrode of the first capacitor, and a second electrode of the first capacitor is connected to a first electrode of the first thin film transistor, a first electrode of the second thin film transistor and a second electrode of the fourth thin film transistor; a gate electrode of the third thin film transistor is connected to a first electrode of the second capacitor, and a second electrode of the second capacitor is connected to a first electrode of the third thin film transistor, a first electrode of the fourth thin film transistor and a second electrode of the second thin film transistor; and a gate electrode of the second thin film transistor is connected to a second electrode of the first thin film transistor; a gate electrode of the fourth thin film transistor is connected to a second electrode of the third thin film transistor.

For example, in the electrostatic prevention circuit provided by at least one embodiment of the present disclosure, the thin film transistor is an N-type MOS thin film transistor.

At least one embodiment of the present disclosure provides an array substrate including an electrostatic prevention circuit which is any one of the electrostatic prevention circuits provided by the embodiments of the present disclosure.

For example, the array substrate provided by at least one embodiment of the present disclosure further includes a first connection structure and a second connection structure, and a first terminal of the electrostatic prevention circuit and a second terminal of the electrostatic prevention circuit are connected to the first connection structure and the second structure respectively.

For example, the array substrate provided by at least one embodiment of the present disclosure includes a plurality of the electrostatic prevention circuits and a plurality of connection structures, a first terminal of each of the electrostatic prevention circuits is connected to a same one of the connection structures, and a second terminal of each of the electrostatic prevention circuits is connected to different ones of the connection structures; or, the array substrate includes a plurality of the electrostatic prevention circuits, a first connection structure and a second connection structure, a first terminal of each of the electrostatic prevention circuits is connected to the first connection structure, and a second terminal of each of the electrostatic prevention circuits is connected to the second connection structure.

For example, in the array substrate provided by at least one embodiment of the present disclosure, each of the connection structures is a signal line or a short-circuit ring, the first connection structure is the signal line or the short-circuit ring, and the second connection structure is the signal line or the short-circuit ring.

For example, in the array substrate provided by at least one embodiment of the present disclosure, the signal line is a gate signal line or a data signal line, and the short-circuit ring is a gate signal line short-circuit ring or a data signal line short-circuit ring.

At least one embodiment of the present disclosure provides a display device, including any one of the array substrates provided by the embodiments of the present disclosure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "In," "out," "on," "under," and the like are only used to indicate relative position relationship, and when the position of the object which is described is changed, the relative position relationship may be changed accordingly.

It should be noted that the figures used to describe the embodiments of the present disclosure are not drawn according to actual proportions, and the figures of the embodiments of the present disclosure are only schematic diagrams. The figures of the embodiments of the present disclosure only relate to structures related to the embodiments of this disclosure, and other structures can be referred to the common designs in the art.

An electrostatic prevention circuit arranged in a display screen or a display panel has an obvious effect on resisting against daily static electricity. At present, a thin film transistor of a large size is generally used as a main structure of the electrostatic prevention circuit, and a power consumption is generated when a current passes through the thin film transistor. In addition, at present, the electrostatic prevention circuit releases all types of static electricity completely during electrostatic discharge (ESD). However, for electrostatic signals generated in a device, the damage of an electrostatic signal of high-frequency and high-voltage characteristics is far greater than that of an electrostatic signal of low-frequency and direct-current characteristics, thus in fact, it is not necessary to release some electrostatic signals of low-frequency and direct-current characteristics immediately. Although there are many mature structures of electrostatic prevention sub-circuit at present, by introducing a capacitor which blocks electrostatic signals of low-frequency and direct-current characteristics, the embodiments of the present disclosure not only greatly reduce the power consumption of the electrostatic discharge (ESD), but also, based on the high pass characteristics of the capacitor, enable the electrostatic prevention circuit to have the ability to prevent static electricity with high frequency, that is, the electrostatic signal of high frequency is released or balanced timely.

At present, in a process of electrostatic discharge of the electrostatic prevention circuit, driven by an electrostatic signal of low-frequency and direct-current characteristics or other direct-current signals, the electrostatic prevention circuit produces a great extra power consumption, especially including the power consumption produced for electrostatic signals of low-frequency and direct-current characteristics which cause a little damage. Thus, particularly in the display field, for example, arranging such electrostatic prevention circuit in the display device is not beneficial to reducing the power consumption of the display device or increasing the battery life of the display device.

At least one embodiment of the present disclosure provides an electrostatic prevention circuit, and the electrostatic prevention circuit includes an electrostatic prevention sub-circuit including a thin film transistor and a capacitor; and a gate electrode of the thin film transistor is connected to the capacitor.

At least one embodiment of the present disclosure provides an array substrate including at least one electrostatic prevention circuit which is any one of the electrostatic prevention circuits provided by the embodiments of the present disclosure.

At least one embodiment of the present disclosure provides a display device, including any one of the array substrates provided by the embodiments of the present disclosure.

It can be seen from the description above, the electrostatic prevention circuit, the array substrate and the display device provided by the embodiments of the present disclosure enable that the thin film transistor is controlled by a signal passing through the capacitor by connecting the gate electrode of the thin film transistor to the capacitor, that is, all signals need to pass through the capacitor before reach the thin film transistor. On one hand, an electrostatic signal of low-frequency and direct-current characteristics does not pass through the capacitor, that is, the electrostatic signal of low-frequency and direct-current characteristics does not reaches the gate electrode of the thin film transistor to turn on the thin film transistor, so that in this case, the electrostatic prevention circuit does not produce a discharge operation and does not cause a power consumption under the electrostatic signal of low-frequency and direct-current characteristics. On the other hand, the capacitor is configured to be connected to the gate electrode of the thin film transistor, so that the electrostatic prevention circuit effectively releases an electrostatic signal of high-frequency and high-voltage characteristics while blocking the electrostatic signal of low-frequency and direct-current characteristics. In addition, the efficiency and stability of a current passing through the thin film transistor are not affected during the electrostatic signal of high-frequency and high-voltage characteristics is released or balanced. Therefore, the electrostatic prevention circuit, the array substrate and the display device provided by the embodiments of the present disclosure effectively reduce the power consumption of the electrostatic prevention circuit while playing a role of electrostatic protection, thus it is beneficial to reducing the power consumption of a device comprising the electrostatic prevention circuit and increasing the battery life of the device.

In the following, the structures, methods and technical effects are described by providing several specific embodiments. A second electrode of the thin film transistor and a first electrode of the thin film transistor are symmetrical structures; thus, in the embodiments of the present disclosure, the first electrode of the thin film transistor is a drain electrode and the second electrode of the thin film transistor is a source electrode, or, the first electrode of the thin film transistor is a source electrode and the second electrode of the thin film transistor is a drain electrode.

Figure 1A:
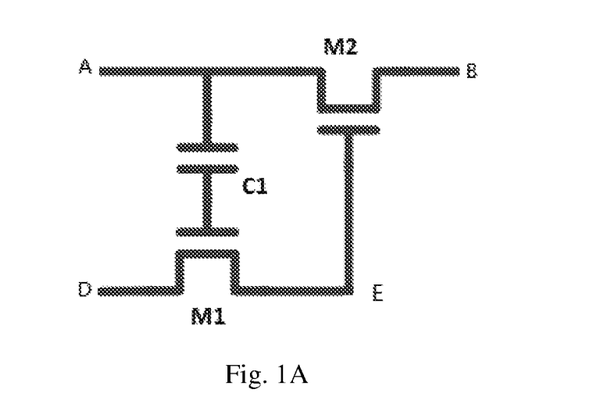
FIG. 1A is a structural schematic diagram of an electrostatic prevention circuit provided by at least one embodiment of the present disclosure.

FIG. 1A is a structural schematic diagram of the electrostatic prevention circuit provided by at least one embodiment of the present disclosure. As illustrated in FIG. 1A, the electrostatic prevention circuit includes an electrostatic prevention sub-circuit, and the electrostatic prevention sub-circuit includes a thin film transistor and a capacitor C1. For example, the electrostatic prevention sub-circuit includes a plurality of thin film transistors, and the thin film transistors include a first thin film transistor M1 and a second thin film transistor M2. A gate electrode of the first thin film transistor M1 is connected to a first electrode of the capacitor C1, and a second electrode of the capacitor C1 is connected to a first electrode of the second thin film transistor M2; a gate electrode of the second thin film transistor M2 is connected to a second electrode of the first thin film transistor M1.

For example, a process of electrostatic protection of the electrostatic prevention circuit provided by at least one embodiment illustrated in FIG. 1A is: an electrostatic signal of high-frequency and high-voltage characteristics which enters the electrostatic prevention circuit from a left side (for example, via a terminal A) of the electrostatic prevention circuit turns on the gate electrode of the thin film transistor M1 after passing through the capacitor C1, so that the electrostatic signal flows from a first electrode of the first thin film transistor M1 to the second electrode of the first thin film transistor M1, then the electrostatic signal turns on the gate electrode of the second thin film transistor M2, so that the electrostatic signal flows from the first electrode of the second thin film transistor M2 to a second electrode of the second thin film transistor M2, in this way, the release or balance of electrostatic signals between the terminal A and a terminal B is realized. Of course, release or balance of electrostatic signals between a terminal D and a terminal E may be realized in a similar way. In a case where a voltage of the electrostatic signal passing through the capacitor C1 is greater than or equal to a threshold voltage of the first thin film transistor M1, the electrostatic signal turns on the first thin film transistor M1. In this way, by connecting the capacitor C1 and the gate electrode of the first thin film transistor M1, the electrostatic signal of high-frequency and high-voltage characteristics turns on the gate electrode of the first thin film transistor M1 after passing through the capacitor C1, and the release of the electrostatic signal of high-frequency and high-voltage characteristics is realized; but, the electrostatic signal of low-frequency and direct-current characteristics does not pass through the capacitor C1 due to the characteristic of the capacitor, which effectively reduces the power consumption of the electrostatic prevention circuit.

Figure 1B:
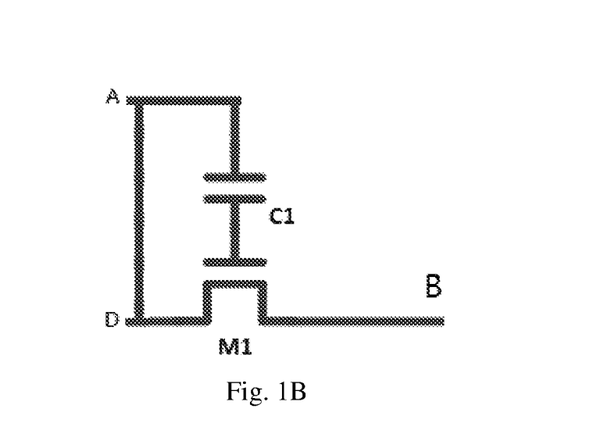
FIG. 1B is another structural schematic diagram of the electrostatic prevention circuit provided by at least one embodiment of the present disclosure.

FIG. 1B is another structural schematic diagram of the electrostatic prevention circuit provided by at least one embodiment of the present disclosure. As illustrated in FIG. 1B, the electrostatic prevention circuit includes the electrostatic prevention sub-circuit, and the electrostatic prevention sub-circuit includes the first thin film transistor M1 and the capacitor C1. The gate electrode of the first thin film transistor M1 is connected to the first electrode of the capacitor C1, and the second electrode of the capacitor C1 is connected to the first electrode of the first thin film transistor M1.

For example, the process of electrostatic protection of the electrostatic prevention circuit provided by at least one embodiment illustrated in FIG. 1B is: the electrostatic signal of high-frequency and high-voltage characteristics which enters the electrostatic prevention circuit from the left side (for example, via the terminal A) of the electrostatic prevention circuit turns on the gate electrode of the thin film transistor M1 after passing through the capacitor C1, so that the electrostatic signal flows from the first electrode of the first thin film transistor M1 to the second electrode of the first thin film transistor M1, which realizes the release or balance of the electrostatic signal of high-frequency and high-voltage characteristics. In a case where the voltage of the electrostatic signal passing through the capacitor C1 is greater than or equal to the threshold voltage of the first thin film transistor M1, the electrostatic signal turns on the thin film transistor M1. In this way, by connecting the capacitor C1 and the gate electrode of the first thin film transistor M1, the electrostatic signal of high-frequency and high-voltage characteristics turns on the gate electrode of the thin film transistor M1 after passing through the capacitor C1, and the release of the electrostatic signal of high-frequency and high-voltage characteristics is realized; but, the electrostatic signal of low-frequency and direct-current characteristics does not pass through the capacitor C1 due to the characteristic of the capacitor, which effectively reduces the power consumption of the electrostatic prevention circuit.

For example, in the electrostatic prevention circuit illustrated in FIG. 1A, the second electrode of the capacitor C1 and the first electrode of the first thin film transistor M1 are connected to different terminals A and D respectively, and the second electrode of the first thin film transistor and the second electrode of the second thin film transistor are connected to different terminals E and B respectively. In this way, the electrostatic prevention circuit possesses four terminals A, B, C and D, and the four terminals are respectively connected to four different positions or four different circuit structures to realize a function of electrostatic protection.

Figure 2:
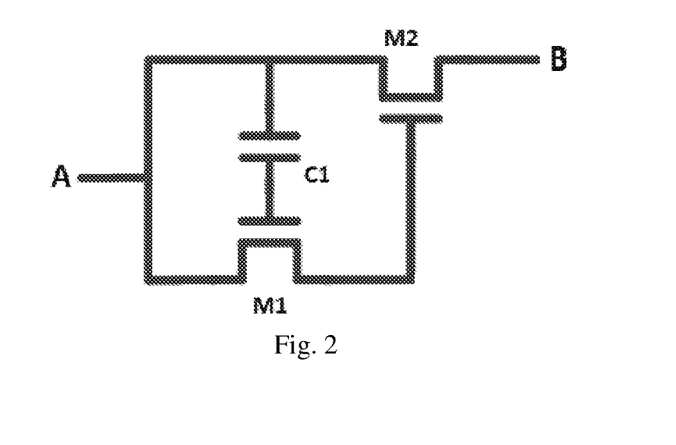
FIG. 2 is further another structural schematic diagram of the electrostatic prevention circuit provided by at least one embodiment of the present disclosure.
Figure 3:
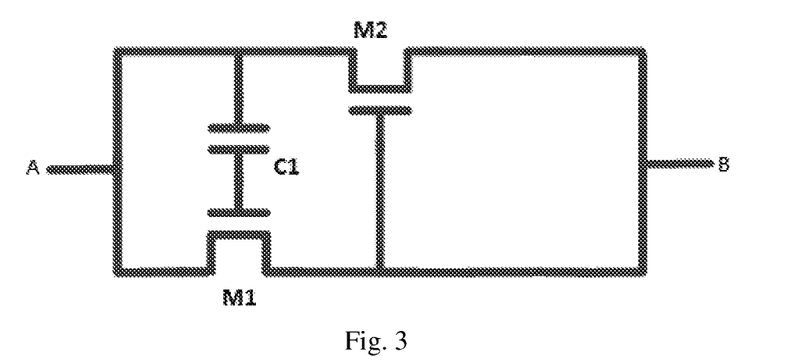
FIG. 3 is further another structural schematic diagram of the electrostatic prevention circuit provided by at least one embodiment of the present disclosure.

In technical arts related to display, the electrostatic prevention circuit for example is required to realize the electrostatic protection between two different positions, so that the electrostatic prevention circuit is configured to have only two terminals. Of course, based on different requirements, according to the structure in FIG. 1 A, the electrostatic prevention circuit for example is provided with three terminals. FIG. 2 is further another structural schematic diagram of the electrostatic prevention circuit provided by at least one embodiment of the present disclosure, FIG. 3 is further another structural schematic diagram of the electrostatic prevention circuit provided by at least one embodiment of the present disclosure. The two electrostatic prevention circuits illustrated in FIG. 2 and FIG. 3 respectively show two different connection manners. In the connection manner illustrated in FIG. 2, both the second electrode of the capacitor C1 and the first electrode of the first thin film transistor M1 are connected to the same terminal A, which enables that the electrostatic prevention circuit has three terminals A, B and E. In the connection manner illustrated in FIG. 3, both the second electrode of the capacitor C1 and the first electrode of the first thin film transistor M1 are connected to the same terminal A, and both the second electrode of the first thin film transistor M1 and the second electrode of the second thin film transistor M2 are connected to the same terminal B, which enables that the electrostatic prevention circuit has two terminals A and B. In this way, the connection of the electrostatic prevention circuit is simpler, and the electrostatic prevention circuit is more suitable for most electrostatic protection applications and the connection rate of the electrostatic prevention circuit is improved, which is beneficial to improve the rate of electrostatic balance between the terminal A and the terminal B.

For example, in some other embodiments of the present disclosure, the electrostatic prevention circuit includes at least two electrostatic prevention sub-circuits, and the at least two electrostatic prevention sub-circuits are connected to each other, so that the electrostatic prevention circuit prevents static electricity bi-directionally. Due to the randomness of generation of the static electricity, the static electricity of opposite directions are likely to be generated at two terminals and at different times. Unlike the current electrostatic prevention circuit that is designed to only realize electrostatic discharge uni-directionally, the present disclosure provides the electrostatic prevention circuit including at least two electrostatic prevention sub-circuits, and the electrostatic prevention circuit realizes electrostatic discharge in different directions by different electrostatic prevention sub-circuits. In this way, a bidirectional electrostatic protection is realized at two terminals of the electrostatic prevention circuit, which improves the efficiency and the effect of the electrostatic protection. Moreover, adopting the electrostatic prevention circuit with a bidirectional symmetrical structure further reduces interference between electrostatic signals and improve the stability and reliability of the electrostatic discharge. Of course, a structure formed by the electrostatic prevention sub-circuits which realize electrostatic protections in different directions respectively also may be designed to be an asymmetric structure according to requirements. In this case, the gate electrode of one thin film transistor or the gate electrode of each of a plurality of thin film transistors is connected to the capacitor in each electrostatic prevention sub-circuit. In this way, all the electrostatic prevention sub-circuits block direct-current electrostatic signals or electrostatic signals of low-frequency and direct-current characteristics by the capacitor to reduce the power consumption while realizing the electrostatic protection.

Figure 4:
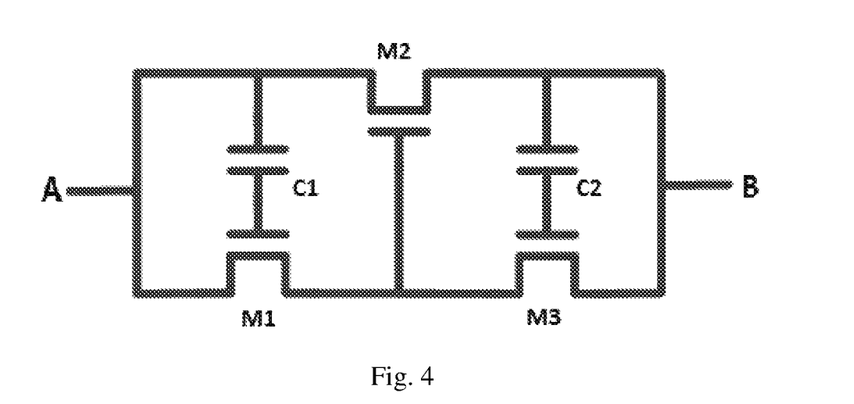
FIG. 4 is further another structural schematic diagram of the electrostatic prevention circuit provided by at least one embodiment of the present disclosure.

For example, FIG. 4 is further another structural schematic diagram of the electrostatic prevention circuit provided by at least one embodiment of the present disclosure. As illustrated in FIG. 4, the electrostatic prevention circuit is symmetric, and the two electrostatic prevention sub-circuits share a same thin film transistor, so as to form a bidirectional symmetrical electrostatic prevention circuit. The electrostatic prevention circuit includes the first thin film transistor M1, the second thin film transistor M2 and a third thin film transistor M3; the electrostatic prevention circuit includes the capacitor C1 referring as a first capacitor C1, and a second capacitor C2; the gate electrode of the first thin film transistor M1 is connected to the first electrode of the first capacitor C1, and the second electrode of the first capacitor C1 is connected to the first electrode of the first thin film transistor M1 and the first electrode of the second thin film transistor M2; the gate electrode of the second thin film transistor M2 is connected to the second electrode of the first thin film transistor M1 and a second electrode of the third thin film transistor M3; a gate electrode of the third thin film transistor M3 is connected to a first electrode of the second capacitor C2, and a second electrode of the second capacitor C2 is connected to a first electrode of the third thin film transistor M3 and the second electrode of the second thin film transistor M2. The first electrode of the second thin film transistor M2 is the source electrode and the second electrode of the second thin film transistor M2 is the drain electrode; or, the first electrode of the second thin film transistor M2 is the drain electrode and the second electrode of the second thin film transistor M2 is the source electrode.

For example, the high-frequency and high-voltage electrostatic signal is input from the terminal A, the high-frequency and high-voltage electrostatic signal turns on the first thin film transistor M1 by utilizing the high pass characteristics and the bootstrap characteristics of the first capacitor C1, and the electrostatic signal flows from the first electrode of the first thin film transistor M1 to the second electrode of the first thin film transistor M1; then the electrostatic signal turns on the second thin film transistor M2, and the electrostatic signal turns on the third thin film transistor M3 by utilizing the high pass characteristics and the bootstrap characteristics of the second capacitor C2, and then the electrostatic signal reaches the terminal B, and thus, the terminal B is an output terminal. Similarly, for example, the high-frequency and high-voltage electrostatic signal is input from the terminal B, the high-frequency and high-voltage electrostatic signal turns on the third thin film transistor M3 by utilizing the high pass characteristics and the bootstrap characteristics of the second capacitor C2, and the electrostatic signal flows from the first electrode of the third thin film transistor M3 to the second electrode of the third thin film transistor M3; then the electrostatic signal turns on the second thin film transistor M2, and the electrostatic signal turns on the first thin film transistor M1 by utilizing the high pass characteristics and the bootstrap characteristics of the first capacitor C1, and then the electrostatic signal reaches the terminal A, and thus, the terminal A is the output terminal. For example, the low-frequency and direct-current electrostatic signal enters from the terminal A, the low-frequency and direct-current electrostatic signal is blocked by the first thin film transistor M1 and the second thin film transistor M2, because the low-frequency and direct-current electrostatic signal does not pass through the first capacitor C1; the low-frequency and direct-current electrostatic signal does not turn on any thin film transistor, so as to realize a purpose of reducing the power consumption. Similarly, for example, the low-frequency and direct-current electrostatic signal enters from the terminal B, the low-frequency and direct-current electrostatic signal is blocked by the second thin film transistor M2 and the third thin film transistor M3, because the low-frequency and direct-current electrostatic signal does not pass through the second capacitor C2; the low-frequency and direct-current electrostatic signal does not turn on any thin film transistor, so as to realize a purpose of reducing the power consumption.

Therefore, the above-mentioned bidirectional symmetrical electrostatic prevention circuit effectively realizes a function of bidirectional electrostatic protection, and because in the above-mentioned electrostatic prevention circuit, a structure of sharing the second thin film transistor M2 is adopted, the structure of the electrostatic prevention circuit is simplified, and the cost is further saved.

Figure 5:
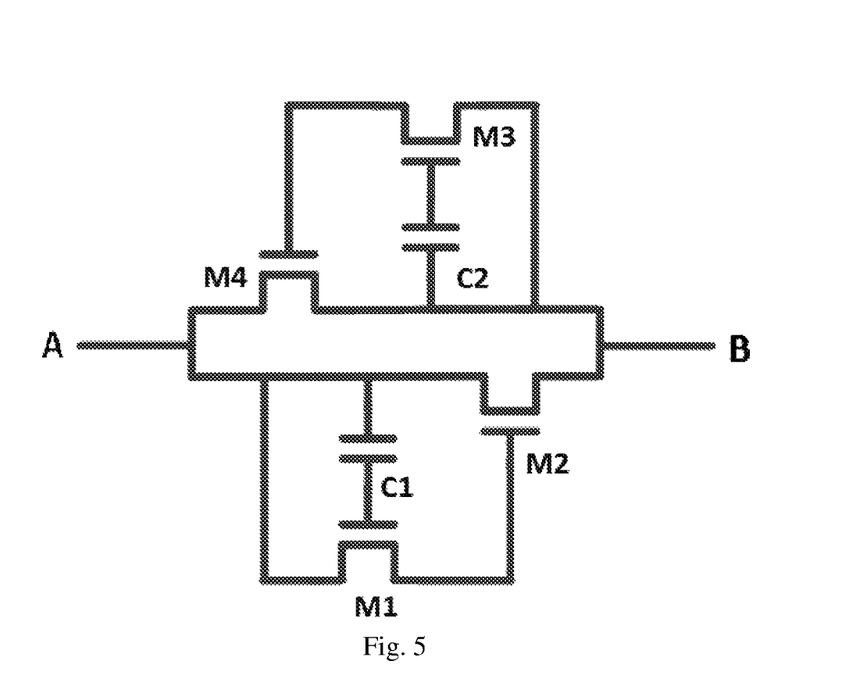
FIG. 5 is further another structural schematic diagram of the electrostatic prevention circuit provided by at least one embodiment of the present disclosure.

For example, FIG. 5 is further another structural schematic diagram of the electrostatic prevention circuit provided by at least one embodiment of the present disclosure. As illustrated in FIG. 5, the electrostatic prevention circuit includes the first thin film transistor M1, the second thin film transistor M2, the third thin film transistor M3 and a fourth thin film transistor M4; the electrostatic prevention circuit includes the first capacitor C1 and the second capacitor C2; the gate electrode of the first thin film transistor M1 is connected to the first electrode of the first capacitor C1, and the second electrode of the first capacitor C1 is connected to the first electrode of the first thin film transistor M1, the first electrode of the second thin film transistor M2 and a second electrode of the fourth thin film transistor M4; the gate electrode of the third thin film transistor M3 is connected to the first electrode of the second capacitor C2, and the second electrode of the second capacitor C2 is connected to the first electrode of the third thin film transistor M3, a first electrode of the fourth thin film transistor M4 and the second electrode of the second thin film transistor M2; the gate electrode of the second thin film transistor M2 is connected to the second electrode of the first thin film transistor M1; a gate electrode of the fourth thin film transistor M4 is connected to the second electrode of the third thin film transistor M3.

The process of electrostatic protection realized by the above-mentioned electrostatic prevention circuit includes: for example, the high-frequency and high-voltage electrostatic signal is input from the terminal A, the high-frequency and high-voltage electrostatic signal turns on the first thin film transistor M1 by utilizing the high pass characteristics and the bootstrap characteristics of the first capacitor C1, and the electrostatic signal flows from the first electrode of the first thin film transistor M1 to the second electrode of the first thin film transistor M1; then the electrostatic signal turns on the second thin film transistor M2, thus the electrostatic signal passes through the second thin film transistor M2 and then reaches the terminal B, and thus, the terminal B is the output terminal of the electrostatic signal. For example, the high-frequency and high-voltage electrostatic signal is input from the terminal B, the high-frequency and high-voltage electrostatic signal turns on the third thin film transistor M3 by utilizing the high pass characteristics and the bootstrap characteristics of the second capacitor C2, and the electrostatic signal flows from the first electrode of the third thin film transistor M3 to the second electrode of the third thin film transistor M3; then the electrostatic signal turns on the fourth thin film transistor M4, thus the electrostatic signal passes through the fourth thin film transistor M4 and then reaches the terminal A, and thus, the terminal A is the output terminal of the electrostatic signal. For example, the low-frequency and direct-current electrostatic signal enters the terminal A, the low-frequency and direct-current electrostatic signal is blocked by the first thin film transistor M1, the second thin film transistor M2 and the fourth thin film transistor M4, because the low-frequency and direct-current electrostatic signal does not pass through the first capacitor C1; the low-frequency and direct-current electrostatic signal does not turn on any thin film transistor, so as to realize the purpose of reducing the power consumption. For example, the low-frequency and direct-current electrostatic signal enters the terminal B, the low-frequency and direct-current electrostatic signal is blocked by the second thin film transistor M2, the third thin film transistor M3 and the fourth thin film transistor M4, because the low-frequency and direct-current electrostatic signal does not pass through the second capacitor C2; the low-frequency and direct-current electrostatic signal does not turn on any thin film transistor, so as to realize a purpose of reducing the power consumption. In this way, the above-mentioned bidirectional symmetrical electrostatic prevention circuit not only realizes the electrostatic protection in different directions, but also reduces interference between components of the circuit and improve the stability of the electrostatic protection, based on that the electrostatic discharge in different directions is realized by different components.

It should be noted that in order to show how to realize the function of the bidirectional electrostatic protection, the electrostatic prevention circuits in FIG. 4 and FIG. 5 are provided with two terminals, however, in an actual use, the electrostatic prevention circuit may be provided with three or more than three terminals according to requirements, as long as not departing from the spirit of low power consumption and bidirectional electrostatic protection in the present disclosure. Limitations are not imposed to the number of the terminals of the electrostatic prevention circuit.

For example, the electrostatic prevention circuit provided by the embodiments of the present disclosure is used in the art of display. For example, the electrostatic prevention circuit is arranged in a display device, for example, the electrostatic prevention circuit is connected to a driving circuit of the display device to prevent static electricity from being generated in the driving circuit.

For example, in some embodiments of the present disclosure, the thin film transistors as described above is an N-type MOS thin film transistor. The characteristics of the N-type MOS thin film transistor enables the electrostatic prevention circuit to be especially suitable for the arts related to the display device.

Figure 6:
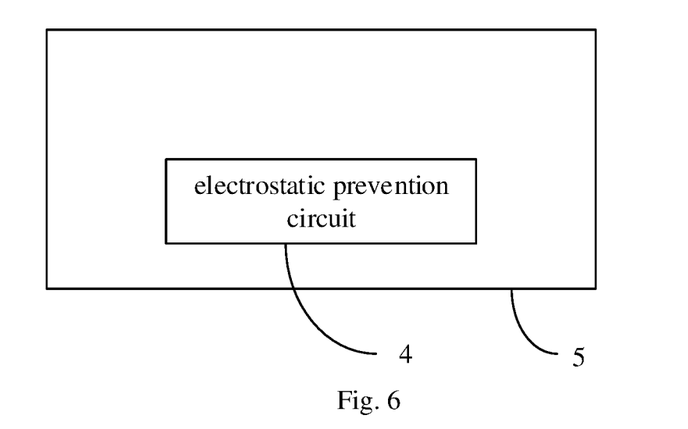
FIG. 6 is a schematic diagram of an array substrate provided by at least one embodiment of the present disclosure.

At least one embodiment of the present disclosure further provides an array substrate including at least one electrostatic prevention circuit which is any one of the electrostatic prevention circuits provided by the embodiments of the present disclosure. FIG. 6 is a schematic diagram of the array substrate provided by at least one embodiment of the present disclosure. For example, an array substrate 5 is a display substrate and includes a driving circuit, and an electrostatic prevention circuit 4 is connected to the driving circuit to prevent the static electricity in the driving circuit. FIG. 6 only shows the structures related to the electrostatic prevention circuit, and other structures may be referred to the common technology in the art.

Figure 7:
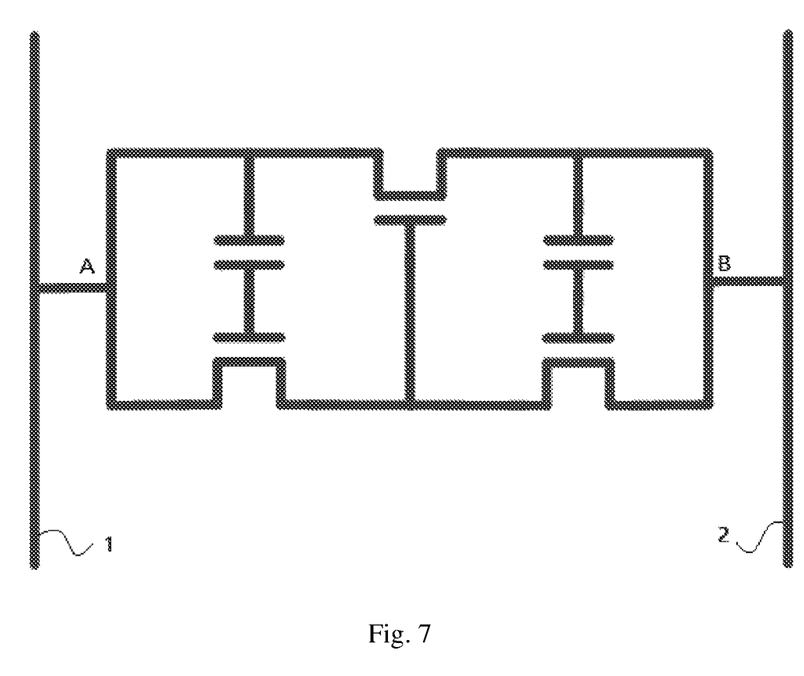
FIG. 7 is a schematic diagram of a connection manner of the electrostatic prevention circuit in the array substrate provided by at least one embodiment of the present disclosure.
Figure 8:
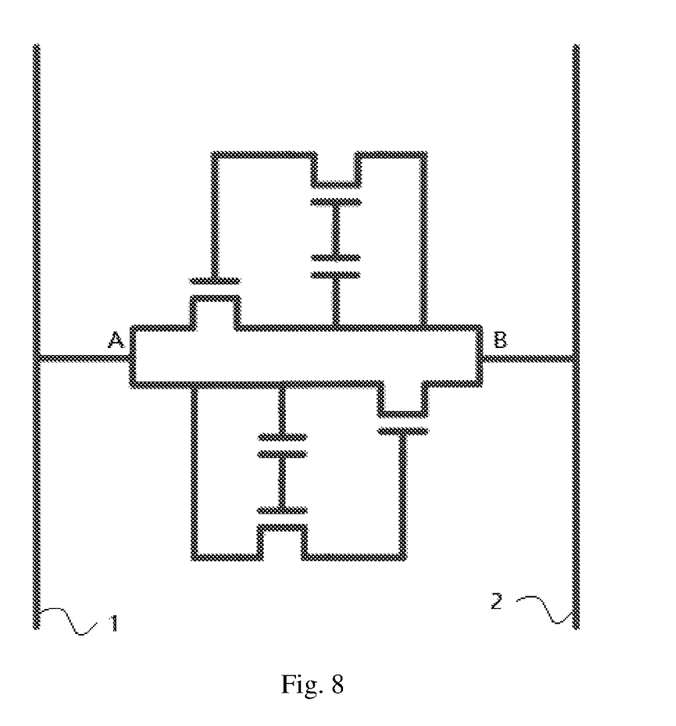
FIG. 8 is another schematic diagram of the connection manner of the electrostatic prevention circuit in the array substrate provided by at least one embodiment of the present disclosure.

In some embodiments of the present disclosure, for example, the electrostatic prevention circuit possesses two terminals which are a first terminal and a second terminal respectively, and the two terminals are connected to a first connection structure and a second connection structure respectively, so as to realize an electrostatic protection between the first connection structure and the second connection structure. For example, FIG. 7 is a schematic diagram of a connection manner of the electrostatic prevention circuit in the array substrate provided by at least one embodiment of the present disclosure, and FIG. 8 is another schematic diagram of the connection manner of the electrostatic prevention circuit in the array substrate provided by at least one embodiment of the present disclosure. As illustrated in FIG. 7 and FIG. 8, for example, the array substrate 5 further includes a first connection structure 1 and a second connection structure 2. For example, the first connection structure and the second connection structure are connection structures in the driving circuit. A first terminal A of the electrostatic prevention circuit 4 and a second terminal B of the electrostatic prevention circuit 4 are connected to the first connection structure 1 and the second connection structure 2 respectively. In this way, in the array substrate provided by at least one embodiment of the present disclosure, the electrostatic prevention circuit 4 provided by the embodiments of the present disclosure realizes a function of electrostatic protection between two different groups of signal lines which are from the first connection structure 1 and the second structure 2 respectively, so that the static electricity at each of the two different groups of signal lines is released or balanced timely.

For example, each of the first connection structure 1 and the second structure 2 is a signal line or a short-circuit ring. For example, in the display technology art, the signal line is a gate signal line or a data signal line, in this way, the electrostatic prevention circuit is arranged according to different types of the signal lines, so as to realize the electrostatic protection with a low power consumption. For example, the first connection structure is the signal line, and the second connection structure is the short-circuit ring; or, the first connection structure is the short-circuit ring, and the second connection structure is the signal line. By arranging the electrostatic prevention circuit between the signal line and the short-circuit ring, the electrostatic signal on the signal line is quickly released by the short-circuit ring through the electrostatic prevention circuit, thus the electrostatic prevention circuit has a good function of electrostatic protection. For example, in the art of display technology, the short-circuit ring is a gate signal line short-circuit ring or a data signal line short-circuit ring. In this way, the electrostatic prevention circuit is arranged according to different types of signal lines and the short-circuit ring corresponding to the type of the signal line, so that the electrostatic protection with the low power consumption is realized.

It should be noted that the first connection structure and the second connection structure are not limited to be the types listed above, and the first connection structure and the second connection structure may be any connection structure or any short-circuit ring that need the electrostatic protection, and limitations are not imposed thereto.

Figure 9:
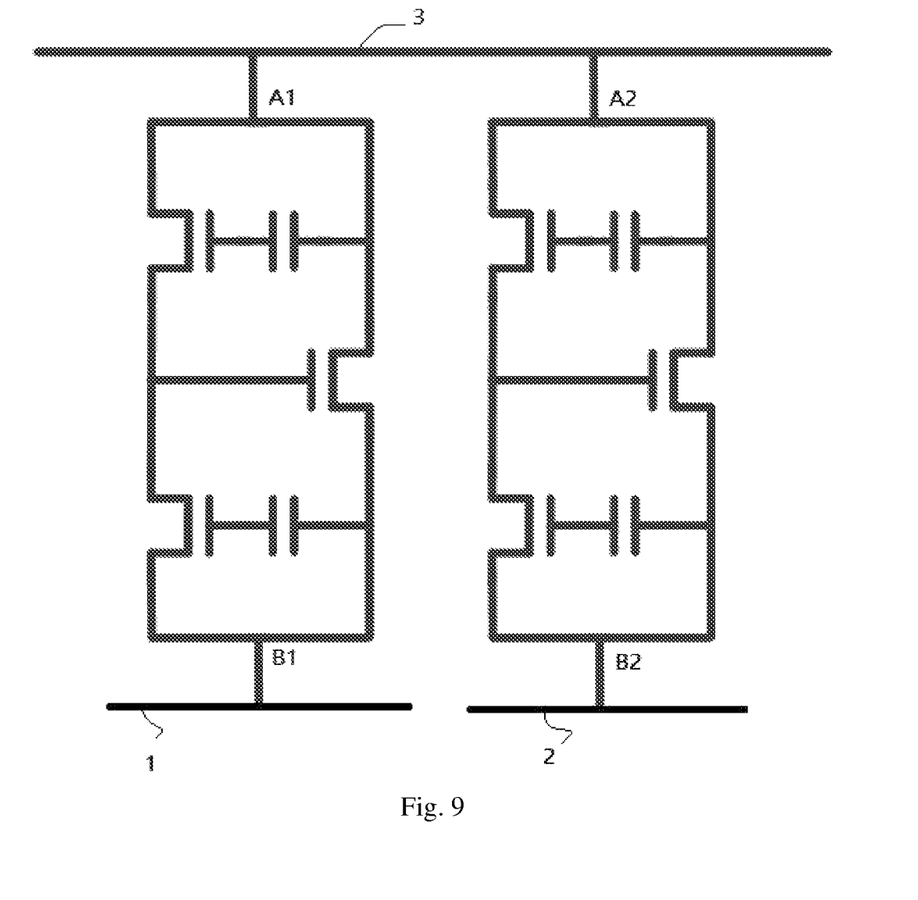
FIG. 9 is further another schematic diagram of the connection manner of the electrostatic prevention circuit in the array substrate provided by at least one embodiment of the present disclosure.
Figure 10:
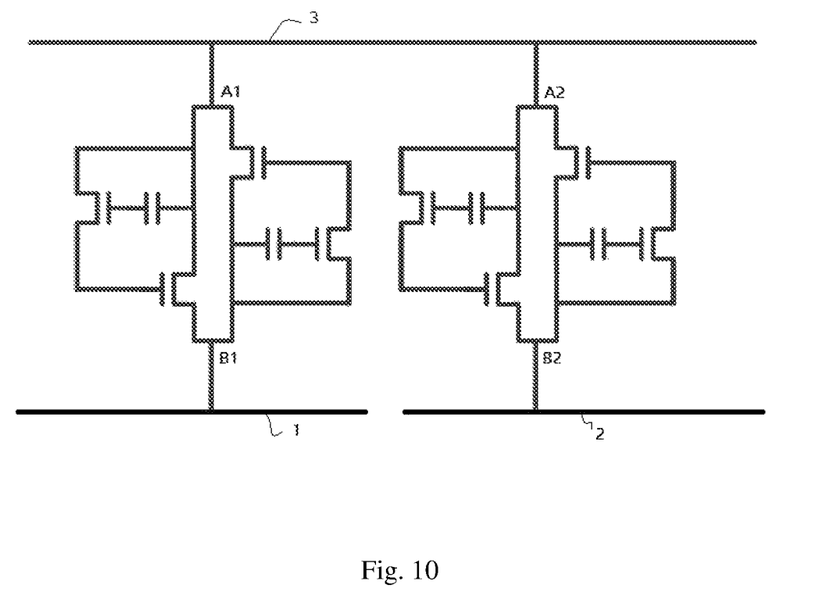
FIG. 10 is further another schematic diagram of the connection manner of the electrostatic prevention circuit in the array substrate provided by at least one embodiment of the present disclosure.

For example, the array substrate includes a plurality of electrostatic prevention circuits and a plurality of connection structures, and the first terminal of each of the electrostatic prevention circuits is connected to a same one of the connection structures, and the second terminal of each of the electrostatic prevention circuits is connected to different ones of the connection structures. For example, FIG. 9 and FIG. 10 respectively are schematic diagrams of two connection manners of the electrostatic prevention circuit in the array substrates provided by the embodiments of the present disclosure. As illustrated in FIG. 9 and FIG. 10, the array substrate includes a plurality of electrostatic prevention circuits, the first connection structure 1, the second connection structure 2 and a third connection structure 3, and both the first terminal A1 of the first electrostatic prevention circuit and the first terminal A2 of the second electrostatic prevention circuit are connected to the third connection structure 3; the second terminal B1 of the first electrostatic prevention circuit is connected to the first connection structure 1; the second terminal B2 of the second electrostatic prevention circuit is connected to the second connection structure 2. For example, the third connection structure 3 is the short-circuit ring, and the first connection structure 1 and the second connection structure 2 are different signal lines respectively, that is, one terminal of each of the plurality of electrostatic prevention circuits is connected to the short-circuit ring, and the other terminal of each of the plurality of electrostatic prevention circuits is connected to different signal lines. In this way, the electrostatic protection for different signal lines is realized according to actual requirements.

Figure 11:
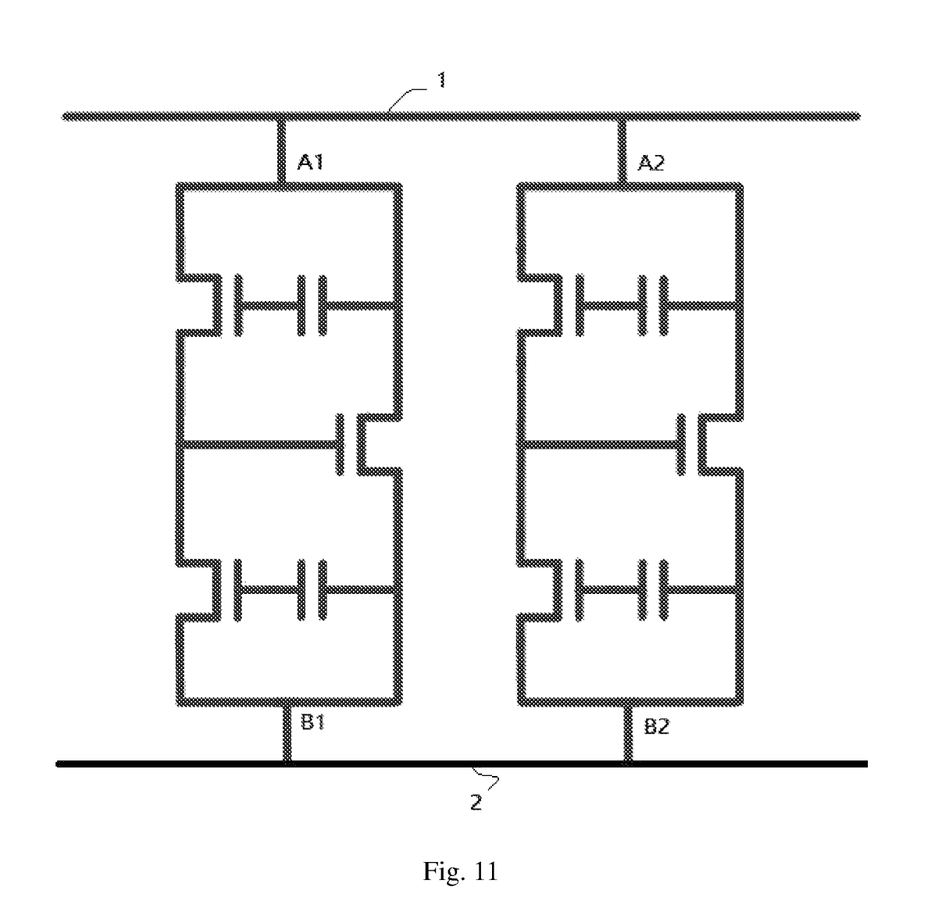
FIG. 11 is further another schematic diagram of the connection manner of the electrostatic prevention circuit in the array substrate provided by at least one embodiment of the present disclosure.

For example, the array substrate includes a plurality of electrostatic prevention circuits, the first connection structure and the second connection structure, the first terminal of each of the electrostatic prevention circuits is connected to the first connection structure, and the second terminal of each of the electrostatic prevention circuits is connected to the second connection structure. For example, FIG. 11 is further another schematic diagram of the connection manner of the electrostatic prevention circuit in the array substrate provided by at least one embodiment of the present disclosure. As illustrated in FIG. 11, the array substrate includes a plurality of electrostatic prevention circuits, the first connection structure 1 and the second connection structure 2, and both the first terminal A1 of the first electrostatic prevention circuit and the first terminal A2 of the second electrostatic prevention circuit are connected to the first connection structure 1; both the second terminal B1 of the first electrostatic prevention circuit and the second terminal B2 of the second electrostatic prevention circuit are connected to the second connection structure 2. Compared to the case where only one electrostatic prevention circuit is arranged between the first connection structure 1 and the second connection structure 2, the structure illustrated in FIG. 11 improves the dispersion rate of the static electricity between the first connection structure 1 and the second connection structure 2. The descriptions above provide several examples of the connection manners of the electrostatic prevention circuit provided by at least one embodiment of the present disclosure in a structure that needs the electrostatic protection.

For example, in the embodiments illustrated in FIG. 9-FIG. 11, the connection structures, for example, the first connection structure 1 or the second connection structure 2 or the third connection structure 3 is the signal line or the short-circuit ring, so that electrostatic protections between different types of connection structures are realized according to actual requirement of electrostatic protections.

Figure 12:
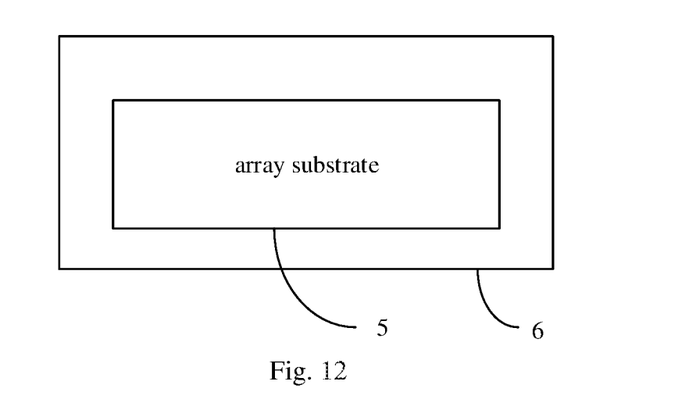
FIG. 12 is a schematic diagram of a display device provided by at least one embodiment of the present disclosure.

At least one embodiment of the present disclosure provides a display device, and the display device includes any one of the array substrates provided by the embodiments of the present disclosure. FIG. 12 is a schematic diagram of the display device provided by at least one embodiment of the present disclosure. FIG. 12 only shows the structures related to the array substrate 5, and other structures of the display device may be referred to the common technology in the art.

It should be noted that a part of the embodiments mentioned above discloses the electrostatic prevention circuit which is applied in the art of liquid crystal display, but the electrostatic prevention circuit provided by the embodiments of the present disclosure is not limited to be applied in the art of liquid crystal display. In addition, although the electrostatic prevention circuit of the present disclosure realizes the low power consumption by utilizing the capacitor, all the structures of the electrostatic prevention circuit of the embodiments of the present disclosure may also be applied in a circuit without the capacitor, so that the electrostatic prevention circuit still realizes the corresponding function of electrostatic protection.

What are described above is related to the illustrative embodiments of the disclosure only and not limitative to the scope of the disclosure; the scopes of the disclosure are defined by the accompanying claims.

The application claims priority to the Chinese patent application No. 201710326955.X, filed on May 10, 2017, the entire disclosure of which is incorporated herein by reference as a part of the present application.

What is claimed is:

1. An electrostatic prevention circuit, comprising: a first thin film transistor and a first capacitor, wherein,
    a gate electrode of the first thin film transistor is connected to a first electrode of the first capacitor;
    the electrostatic prevention circuit further comprises a second thin film transistor, a third thin film transistor, a fourth thin film transistor, and a second capacitor;
    a second electrode of the first capacitor is connected to a first electrode of the first thin film transistor, a first electrode of the second thin film transistor and a second electrode of the fourth thin film transistor;
    a gate electrode of the third thin film transistor is connected to a first electrode of the second capacitor, and a second electrode of the second capacitor is connected to a first electrode of the third thin film transistor, a first electrode of the fourth thin film transistor and a second electrode of the second thin film transistor;
    a gate electrode of the second thin film transistor is connected to a second electrode of the first thin film transistor; and
    a gate electrode of the fourth thin film transistor is connected to a second electrode of the third thin film transistor.

2. The electrostatic prevention circuit according to claim 1, wherein, the first thin film transistor, the second thin film transistor, the third thin film transistor and the fourth thin film transistor are an N-type MOS thin film transistor.

3. An array substrate, comprising the electrostatic prevention circuit according to claim 1.

4. The array substrate according to claim 3, further comprising a first connection structure and a second connection structure, wherein,
    a first terminal of the electrostatic prevention circuit and a second terminal of the electrostatic prevention circuit are connected to the first connection structure and the second structure respectively.

5. The array substrate according to claim 4, wherein, each of the first connection structure and the second connection structure is a signal line or a short-circuit ring.

6. The array substrate according to claim 5, wherein, the signal line is a gate signal line and or a data signal line, and the short-circuit ring is a gate signal line short-circuit ring or a data signal line short-circuit ring.

7. The array substrate according to claim 3, wherein,
    the array substrate comprises a plurality of the electrostatic prevention circuits and a plurality of connection structures, a first terminal of each of the electrostatic prevention circuits is connected to a same one of the connection structures, and a second terminal of each of the electrostatic prevention circuits is connected to different ones of the connection structures.

8. The array substrate according to claim 7, wherein, each of the connection structures is a signal line or a short-circuit ring.

9. The array substrate according to claim 8, wherein, the signal line is a gate signal line or a data signal line, and the short-circuit ring is a gate signal line short-circuit ring or a data signal line short-circuit ring.

10. The array substrate according to claim 3, wherein,
    the array substrate comprises a plurality of the electrostatic prevention circuits, a first connection structure and a second connection structure, a first terminal of each of the electrostatic prevention circuits is connected to the first connection structure, and a second terminal of each of the electrostatic prevention circuits is connected to the second connection structure.

11. A display device, comprising the array substrate according to claim 3.

* * * * *